(12) United States Patent
Chen et al.

(10) Patent No.: US 7,966,581 B2
(45) Date of Patent: Jun. 21, 2011

(54) GENERIC NON-VOLATILE SERVICE LAYER

(75) Inventors: Yiran Chen, Eden Prairie, MN (US); Dadi Setiadi, Edina, MN (US); Hai Li, Eden Prairie, MN (US); Haiwen Xi, Prior Lake, MN (US); Hongyue Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 387 days.

(21) Appl. No.: 12/252,564

(22) Filed: Oct. 16, 2008

(65) Prior Publication Data

US 2010/0100857 A1    Apr. 22, 2010

(51) Int. Cl.
*G06F 17/50* (2006.01)

(52) U.S. Cl. ............ 716/51; 716/106; 716/111; 714/25; 714/30; 713/151

(58) Field of Classification Search .................... 716/51, 716/106, 111; 714/25, 30; 713/151
See application file for complete search history.

(56) References Cited

U.S. PATENT DOCUMENTS

| | | | | |
|---|---|---|---|---|
| 6,551,857 B2 * | 4/2003 | Leedy | | 438/109 |
| 7,064,018 B2 | 6/2006 | Madurawe | | |
| 7,219,271 B2 * | 5/2007 | Kleveland et al. | | 714/718 |
| 7,312,109 B2 | 12/2007 | Madurawe | | |
| 7,334,159 B1 * | 2/2008 | Callaghan | | 714/30 |
| 7,379,327 B2 * | 5/2008 | Chen et al. | | 365/158 |
| 7,402,897 B2 * | 7/2008 | Leedy | | 257/678 |
| 7,412,343 B2 * | 8/2008 | Stroud et al. | | 702/120 |
| 7,463,062 B2 * | 12/2008 | Or-Bach et al. | | 326/41 |
| 7,694,196 B2 * | 4/2010 | Schnell et al. | | 714/723 |
| 7,750,421 B2 * | 7/2010 | Horng et al. | | 257/421 |
| 2005/0023656 A1 * | 2/2005 | Leedy | | 257/678 |
| 2005/0066226 A1 * | 3/2005 | Adams et al. | | 714/7 |
| 2005/0278666 A1 * | 12/2005 | Diamond | | 716/4 |
| 2007/0080448 A1 | 4/2007 | DeMulder et al. | | |
| 2008/0142959 A1 | 6/2008 | DeMulder et al. | | |
| 2008/0163139 A1 | 7/2008 | Scheffer et al. | | |
| 2008/0229269 A1 * | 9/2008 | Lamorey | | 716/12 |
| 2008/0284611 A1 * | 11/2008 | Leedy | | 340/815.4 |
| 2009/0063916 A1 * | 3/2009 | Vogelsang | | 714/719 |
| 2009/0106716 A1 * | 4/2009 | Aleksanyan et al. | | 716/5 |
| 2009/0129186 A1 * | 5/2009 | Schnell et al. | | 365/201 |
| 2009/0194768 A1 * | 8/2009 | Leedy | | 257/48 |
| 2009/0300441 A1 * | 12/2009 | Andreev et al. | | 714/718 |
| 2010/0061207 A1 * | 3/2010 | Trantham | | 369/53.1 |
| 2010/0083037 A1 * | 4/2010 | Oberlaender | | 714/5 |

OTHER PUBLICATIONS

Weisheng Zhao, Eric Belhaire, Bernard Dieny, Guillaume Prenat and Claude Chappert, "TAS-MRAM based Non-volatile FPGA logic circuit," IEEE, 2007, 1-8.

Jing Li, "An Alternate Design Paradigm using Scaled Low Temperature Poly-Silicon Thin Film Transistor (LTPS TFT) for Low Power and Low-Cost Applications," Sep. 2007, 1-90, Purdue University, US.

* cited by examiner

*Primary Examiner* — Naum Levin

(74) *Attorney, Agent, or Firm* — Fellers, Snider, et al.

(57) ABSTRACT

Method and apparatus for constructing and operating an integrated circuit in an electronic device. In some embodiments, a generic service layer is integrated in a three dimensional integrated circuit and tested using a testing pattern stored in a non-volatile memory. The generic service layer is reconfigured to a permanent non-testing functional component of the integrated circuit.

16 Claims, 6 Drawing Sheets

GENERIC NON-VOLATILE SERVICE LAYER

BACKGROUND

Electronic devices generally operate to store and retrieve data in a fast and efficient manner. Some storage devices utilize numerous chips on a circuit board to facilitate the various functions of the device. The chips occasionally are stacked vertically and packaged to save space on a circuit board.

As will be appreciated, individual chips in a package may be subject to errors that are inherent with manufacturing variance and which may not be easily corrected once packaged. The reliability of the circuit board may accordingly be hindered when multiple functions are connected in a single package. Thus, errors can affect the functionality of packaged chips so that considerable loss in efficiency and accuracy is noticeable.

In these and other types of electronic devices, it is often desirable to increase simplicity and accuracy, particularly with regard to reliability of components of a chip package once packaged.

SUMMARY

Various embodiments of the present invention are generally directed to a method and apparatus for constructing and operating an integrated circuit in an electronic device.

In accordance with various embodiments, a generic service layer is integrated in a three dimensional integrated circuit. The integrated circuit is tested using a testing pattern stored in a non-volatile memory and reconfigured to be a permanent non-testing function of the integrated circuit.

In other embodiments, a three dimensional integrated circuit comprises a generic non-volatile service layer affixed to a host layer in a multi-layer integrated circuit chip package. The generic non-volatile service layer is configured in a first configuration to test the host layer using a test pattern stored in a non-volatile memory. A reconfiguration of the generic non-volatile service layer to a second configuration results in a permanent non-testing component of the integrated circuit.

These and various other features and advantages which characterize the various embodiments of the present invention can be understood in view of the following detailed discussion and the accompanying drawings.

DETAILED DESCRIPTION

Figure 1:
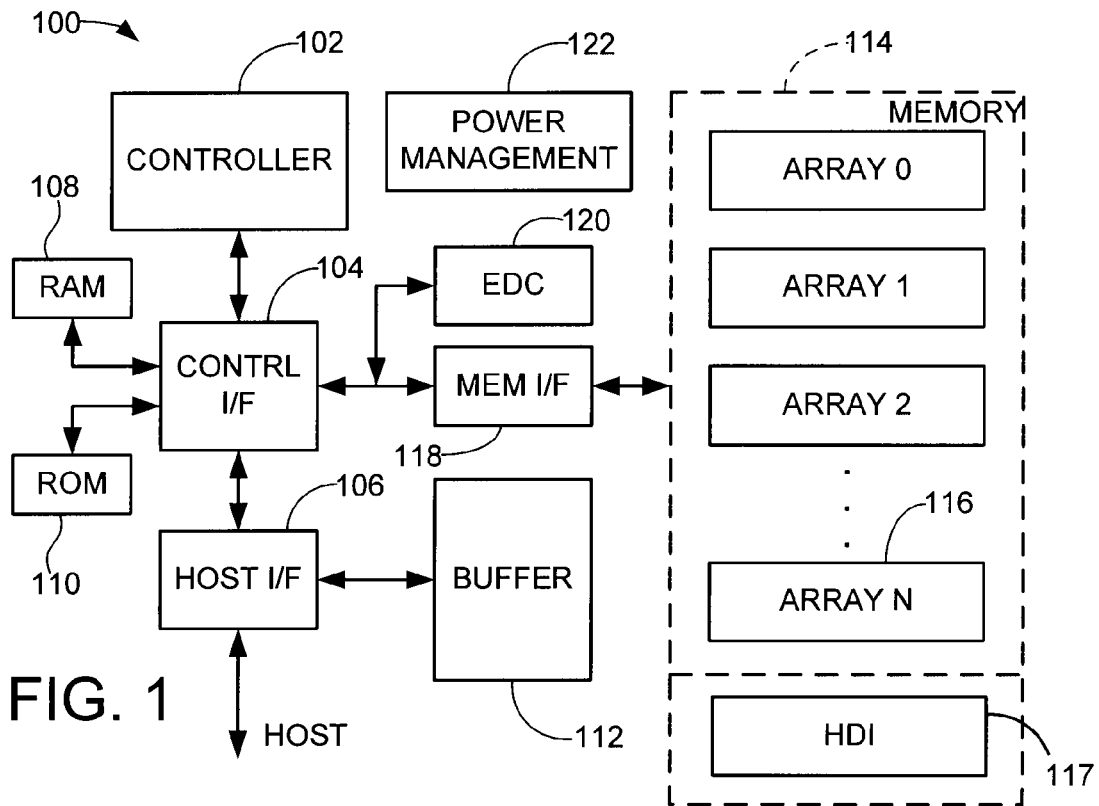
FIG. 1 is a generalized functional representation of an exemplary electronic device constructed and operated in accordance with various embodiments of the present invention.

FIG. 1 provides a functional block representation of an electrical device 100, such as a data storage device constructed and operated in accordance with various embodiments of the present invention. The electrical device is contemplated as comprising a three dimensional integrated circuit. It will be appreciated, however, that such characterization of the device 100 is merely for purposes of illustrating a particular embodiment and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 serves to temporarily store input write data from the host device and readback data pending transfer to the host device.

A memory space is shown at 114 to comprise a number of memory arrays 116 (denoted Array 0-N), although it will be appreciated that a single array can be utilized as desired. Each array 116 comprises a block of semiconductor memory of selected storage capacity. Further in the memory space 114, a hard disk interface 117 can be included to allow a magnetic data storage device to be implemented. The hard disk interface 117 can be accessed by the memory interface 118 either individually or in combination with other data storage memory arrays 116.

Communications between the controller 102 and the memory space 114 are coordinated via a memory (MEM) I/F 118. As desired, on-the-fly error detection and correction (EDC) encoding and decoding operations are carried out during data transfers by way of an EDC block 120.

While not limiting, in some embodiments the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
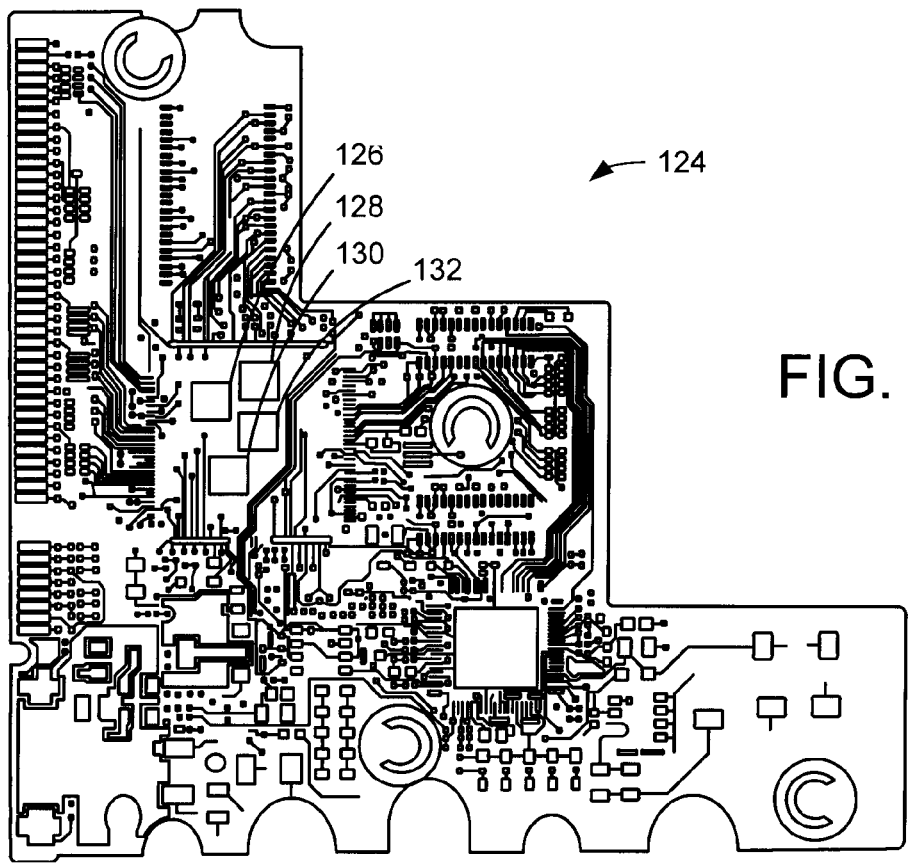
FIG. 2 illustrates a conventional printed circuit board.

FIG. 2 provides an exemplary printed circuit board 124. A printed circuit board 124 is often utilized in various electronic devices 100 including, but not limited to, data storage devices. The functions of an electronic device 100 are controlled by the hardware installed on, and connected by, the printed circuit board 124. Hardware on a printed circuit board 124 can include an application specific integrated circuit (ASIC) controller 126, a memory buffer 128, control logic 130, and a signal processor 132, as a nonlimiting list of examples. It should be noted that the printed circuit board 124 can employ numerous individual chips with independent functions, individual chips with multiple functions, or a single package having multiple functions either alone or in combination with one another. For example the memory buffer 128 can consist of two dies: a non-volatile memory such as, but not limited to NOR flash, and a volatile memory such as, but not limited to dynamic RAM (DRAM).

Figure 3:
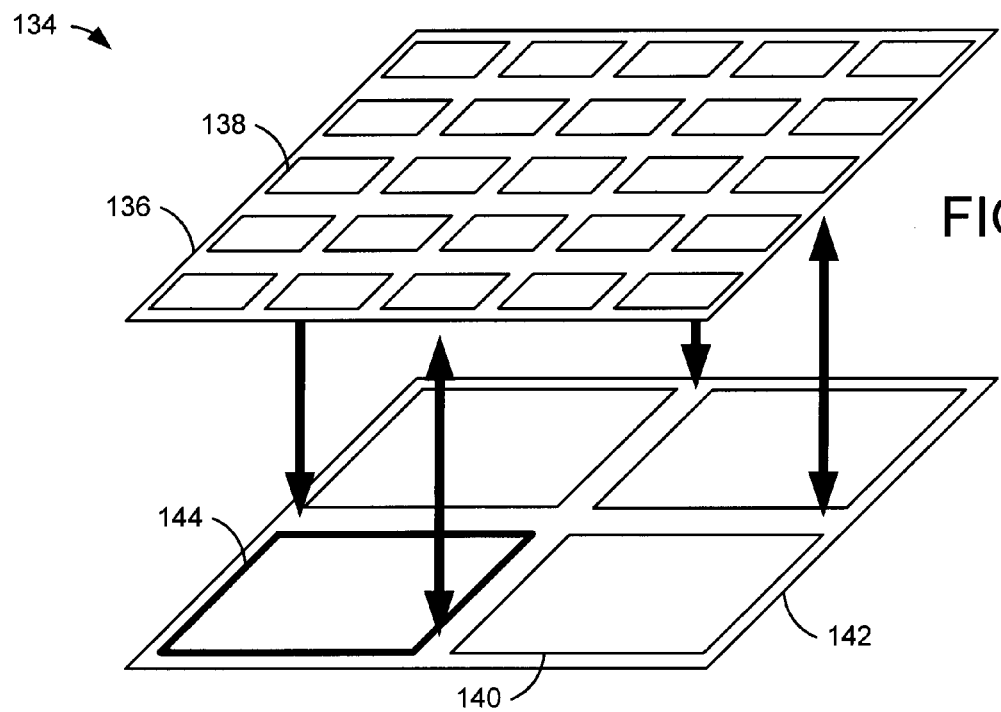
FIG. 3 shows generic non-volatile service layer operated in accordance with various embodiments of the present invention.

A generic non-volatile service layer 134 operated in accordance with various embodiments of the present invention is displayed in FIG. 3. The service layer 134 can be configured as a testing layer 136. In some embodiments, an array of unit test structures (UTS) 138 is included in the testing layer 136. In some embodiments, the UTS 138 are programmable to test host functions 140 with a testing pattern stored in a non-volatile memory. In addition, the host functions 140 are coupled to a host layer 142.

It can be appreciated that one, or many host functions 140 can be included in the host layer 142. Furthermore, a selected host function 140 can have a test wrapper 144 at least partially surrounding it to isolate the testing of a single function 140. However, several test wrappers 144 can be implemented on various host functions 140 to be tested simultaneously or in succession.

Figure 4:
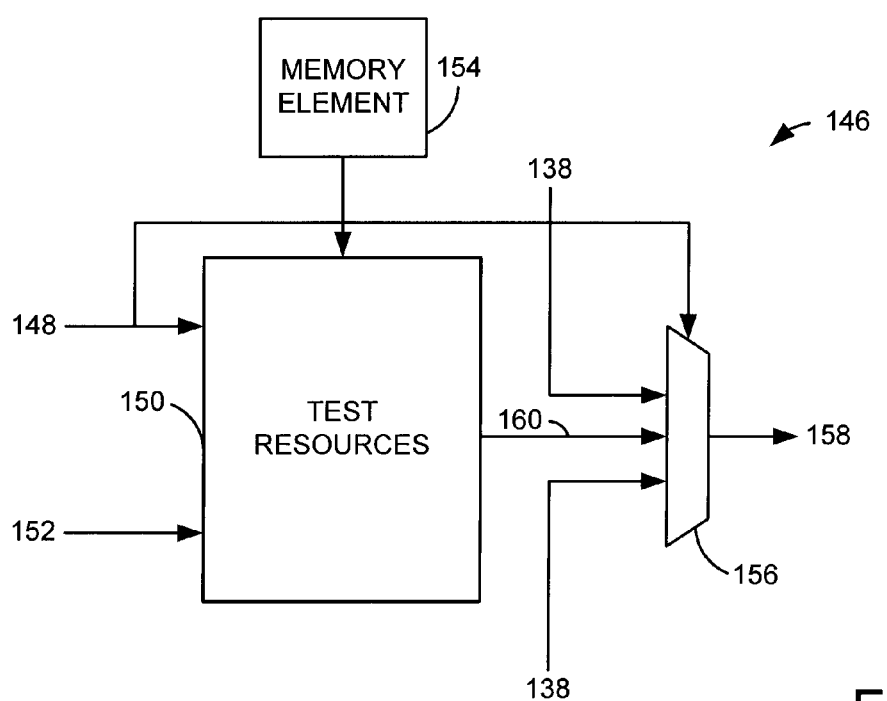
FIG. 4 displays control circuitry of a generic non-volatile service layer operated in accordance with the various embodiments of the present invention.

The control circuitry 146 of the testing layer 136 of FIG. 3 operated in accordance with various embodiments of the present invention is shown in FIG. 4. A configuration input 148 can be configured to provide configuration data to the test resources 150. The test resources 150 can include one, or many, UTS 138 or an alternative test component to examine the operation of the host layer 142. The test resources 150 can be configured to perform a variety of combinational or sequential logic operations which can be programmed by the configuration data. In addition to the configuration input 148, an input register 152 provides data to the test resources 150. The functionality of the test resources 150 can be implemented by various testing patterns that can be stored in the memory element 154 that can comprise spin torque random access memory (STRAM), resistive random access memory (RRAM), or phase change random access memory (PCRAM).

In various embodiments, the configuration data is routed to a multiplexer 156 that sends output data 158. The multiplexer can also be configured to receive output test signals 160 from the test resources 150. Further, various UTS 138 can be inputted to the multiplexer 156 to provide more accurate output data 158. It can be appreciated by a skilled artisan that the multiplexer 156 can be configured to receive a single, or numerous inputs. Likewise, the test resources 150 can be configured to be a single type of resource, such as a sensor, or a variety of types of resources to work simultaneously or in succession to provide test output signals 160.

Figure 5:
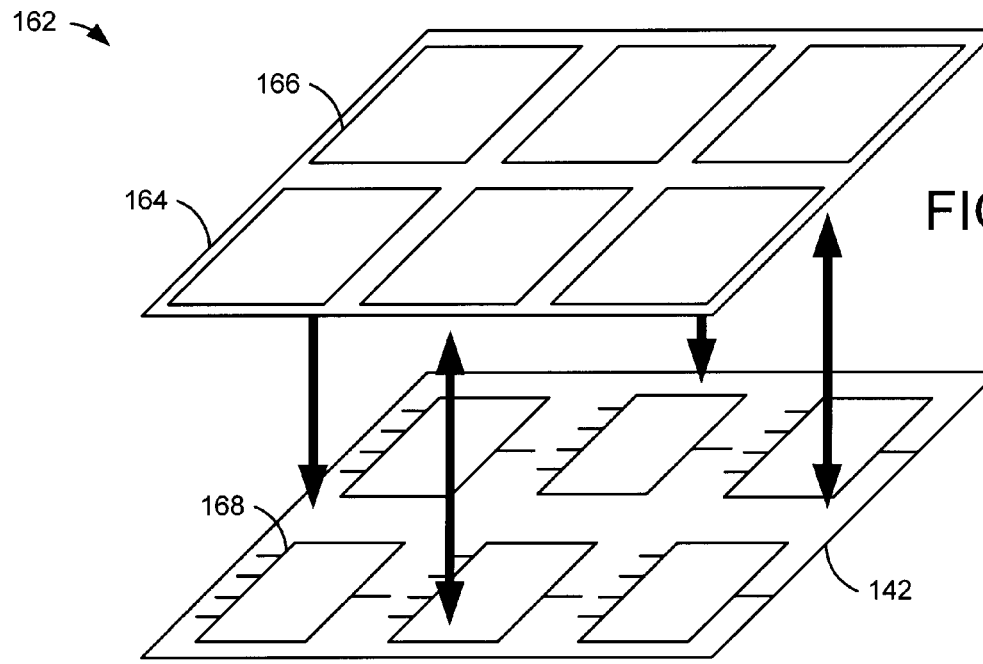
FIG. 5 shows a generic non-volatile service layer operated in accordance with various embodiments of the present invention.

A generic non-volatile service layer 162 operated in accordance with various embodiments is shown in FIG. 5. A performance layer 164 is configured with an array of memory cells 166. The memory cells 166 can comprise various volatile and non-volatile memories such as, but not limited to STRAM, RRAM, PCRAM, dynamic random access memory (DRAM), or static random access memory (SRAM). The performance layer 164 is configured to communicate with a look-up table 168 positioned on the host layer 142. It should be noted that an array of look-up tables 168 can be implemented on the host layer 142 and capable of communicating with the memory cells 166 of the performance layer 164. Further, the array of memory cells 166 can be configured to operate in a manner similar to a field programmable gate array (FPGA).

Figure 6:
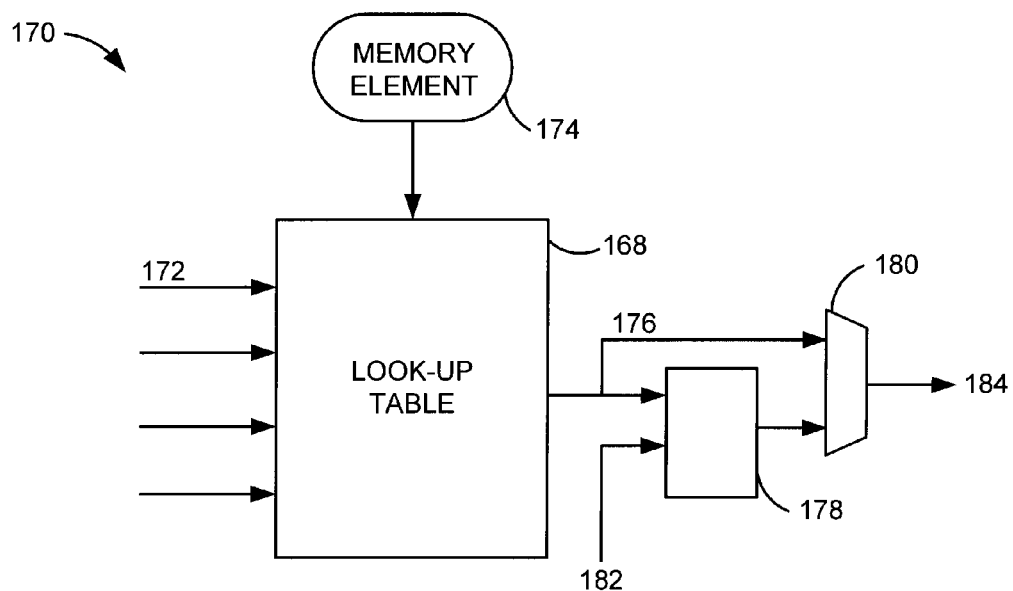
FIG. 6 displays control circuitry of a generic non-volatile service layer operated in accordance with various embodiments of the present invention.

FIG. 6 generally illustrates control circuitry 170 operated in accordance with various embodiments of the present invention. A plurality of inputs 172 is shown sending signals to the look-up table 168 of FIG. 5. In some embodiments, a memory element 174 is connected to the look-up table 168 and allows for dynamically configuring the table. It should be noted that the memory element 174 can comprise various memories including, but not limited to, STRAM, RRAM, PCRAM, DRAM, and SRAM. The look-up table 168 sends a table output 176 to a delay flip flop (DFF) 178 as well as a multiplexer 180. The DFF 178 has an input clock signal 182 controlling the operation of the flip flop 178. Finally, the multiplexer 180 sends a multiplexer output 184 to a host (not shown).

Figure 7:
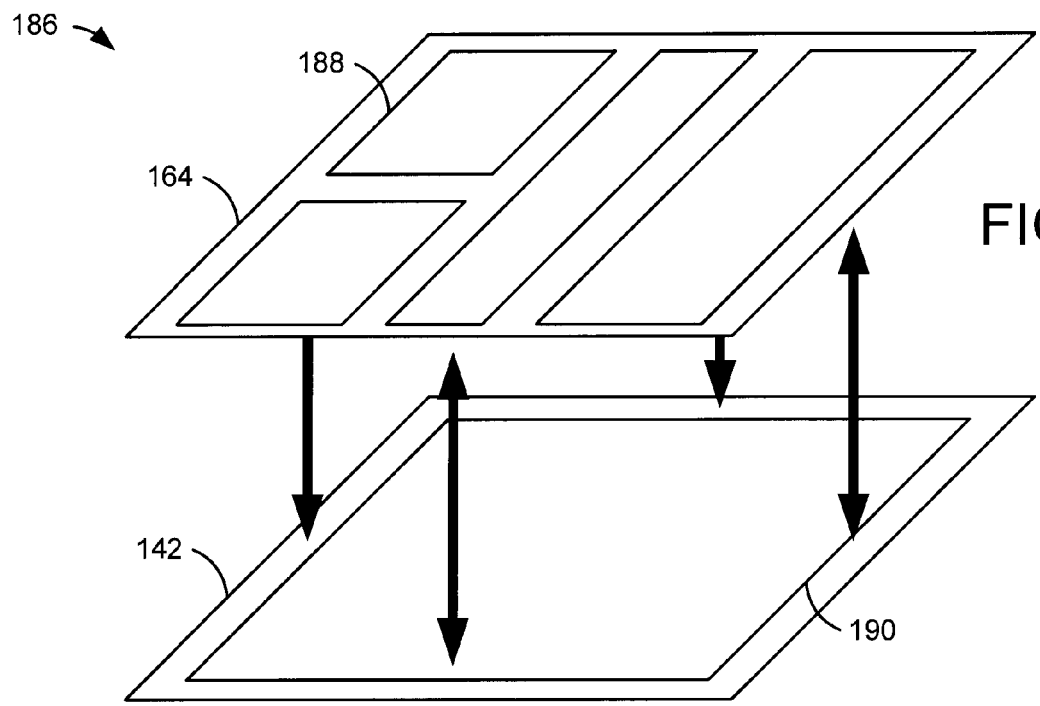
FIG. 7 illustrates a generic non-volatile service layer operated in accordance with various embodiments of the present invention.

FIG. 7 shows a generic non-volatile service layer 186 operated in accordance with various embodiments of the present invention. A performance layer 164 is configured to comprise various security components 188. The security components 188 can include, but are not limited to, a key, identification, handler, and configuration file. The security components 188 are configured to communicate with an integrated circuit 190 implemented on the host layer 142. The communication between the security components 188 and the integrated circuit 190 can be configured to determine that the proper user is accessing the integrated circuit 190. Further, the security components 188 can restrict access to the integrated circuit to only predetermined users.

It can be appreciated that the security components 188 can comprise a variety of data storage arrays. When the input key matches the device-specific key under certain algorithms, the data will be written into a predetermined storage component to allow full functionality of the performance layer 164.

Figure 8:
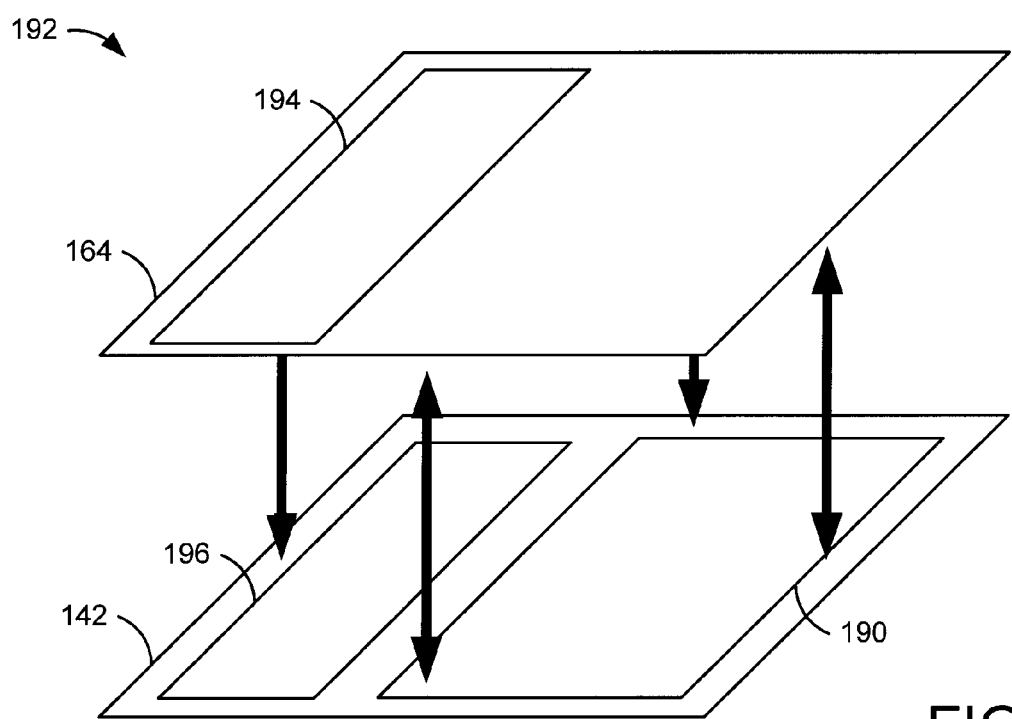
FIG. 8 shows a generic non-volatile service layer operated in accordance with various embodiments of the present invention.

FIG. 8 generally illustrates a generic non-volatile service layer 192 operated in accordance with various embodiments of the present invention. A performance layer 164 is configured to include at least a configuration region 194 that communicates with routing matrix 196 coupled to the host layer 142, and integrated circuit 190. The configuration region 194 allows for the rerouting of circuitry such as, but not limited to, decoder address or redundant components. The inputs of such a routing matrix can be stored in the performance layer 164 with programmability and reconfigured to correspond to redundancy requirements of the host layer 142.

Figure 9:
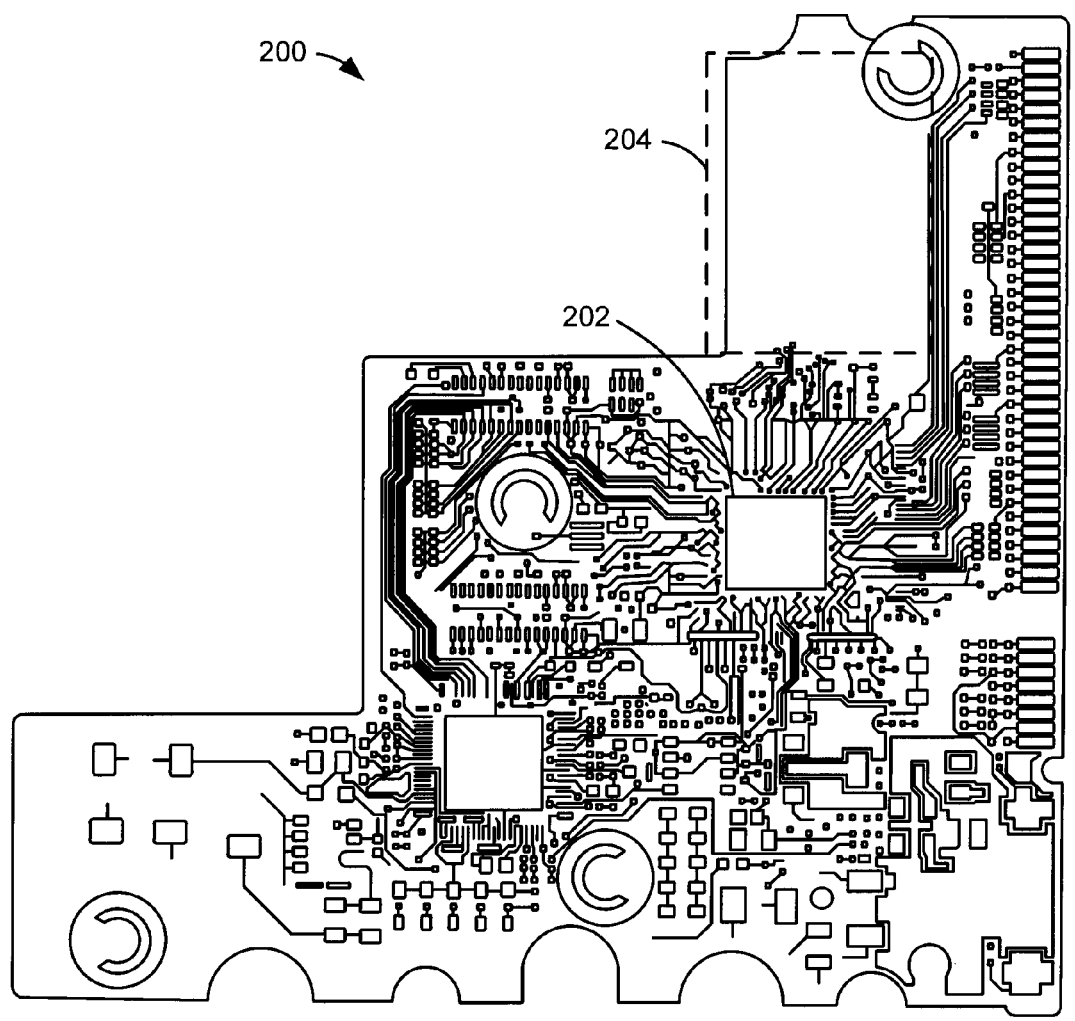
FIG. 9 displays a printed circuit board utilizing a generic non-volatile service layer constructed in accordance with various embodiments of the present invention.

In FIG. 9, a printed circuit board 200 is generally illustrated employing a package 202 constructed in accordance with various embodiments of the present invention. The generic non-volatile service layer 134 can be implemented in an integrated circuit that is installed on a printed circuit board 200. The integrated circuit can be a three-dimensional chip package 202. In some embodiments, the generic non-volatile service layer 134 is configured to test an integrated circuit and subsequently reconfigured to a performance function such as, but not limited to, FPGA, security protocol, or redundancy correction as shown in FIGS. 5, 7, and 8. The installation of a three-dimensional package eliminates the need for connection pathways on the printed circuit board 200 and creates a blank area 204 where no electrical connections are present. The blank area 204 surrounds the primary area of circuit board interconnect savings that leads to greater circuit board 200 performance due in part to reduced noise.

Figure 10:
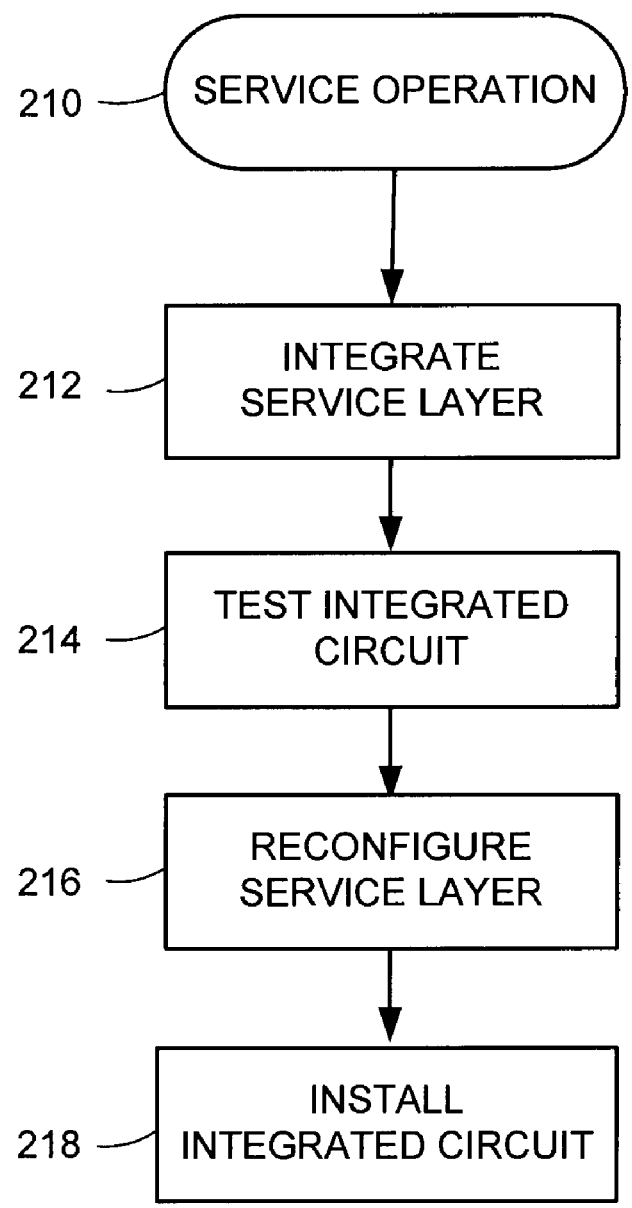
FIG. 10 a flow diagram of a service operation carried out in accordance with the various embodiments of the present invention.

FIG. 10 displays a flow diagram of a service operation 210 performed in accordance with the various embodiments of the present invention. The service operation 210 initially integrates the generic non-volatile service layer 134 to a host layer 142 of a three dimensional integrated circuit at step 212. In step 214, the service layer 134 is tested with a testing pattern stored in non-volatile memory to ensure quality and reliability of the integrated circuit. The service layer 134 is reconfigured to carry out a performance function in step 216. The performance function can be, but is not limited to, a FPGA, security protocol, or redundancy correction. In some embodiments, the performance function of the service layer 134 is a permanent function of the integrated circuit. Finally, the integrated circuit is installed in an electronic device that can be, but is not limited to, a printed circuit board such as 200 of FIG. 9.

As can be appreciated by one skilled in the art, the various embodiments illustrated herein provide advantages in both electronic device efficiency and complexity. The use of tested and repaired known good die in conjunction with single function chips in a package increases the performance of the electrical device while reducing the noise associated with conventional chip integration. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising a three dimensional integrated circuit comprising a generic non-volatile service layer affixed to a host layer in a multi-layer integrated circuit chip package, wherein the generic non-volatile service layer is configured in a first configuration to test the host layer using a test pattern stored in a non-volatile memory, and then to be reconfigured in a security protocol where the host layer uses at least one security component on the service layer to restrict access to the integrated circuit as a permanent non-testing functional component of the integrated circuit.

2. The apparatus of claim 1, wherein the non-volatile memory is a spin torque random access memory (STRAM) of said generic service layer.

3. The apparatus of claim 1, wherein the non-volatile memory is a resistive random access memory (RRAM) of said generic service layer.

4. The apparatus of claim 1, further comprising a control circuit which initially configures the service layer in the first configuration, executes said testing of the host layer, and then places the service layer in the second configuration.

5. The apparatus of claim 1, wherein the non-testing functional component comprises a field programmable gate array (FPGA).

6. The apparatus of claim 5, wherein an array of look-up tables are each connected to a delay flip flop in the generic service layer.

7. The apparatus of claim 1, wherein the non-testing functional component is a redundancy correction for the host layer.

8. The apparatus of claim 1, wherein the generic non-volatile service layer comprises an array of unit test structures when configured in the first configuration to test the host layer.

9. The apparatus of claim 1, wherein the at least one security component is a key, identification, handler, or configuration file that communicates with the integrated circuit.

10. The apparatus of claim 1, wherein the security protocol restricts access to the integrated circuit by matching an input key to a device specific key.

11. An apparatus comprising a printed circuit board which operationally supports a multi-layer integrated circuit chip package arranged as a three dimensional integrated circuit and comprising a host layer and a generic non-volatile service layer, the service layer comprising a non-volatile memory which stores a test pattern adapted to test the host layer during a testing mode of operation and which stores security component data adapted to prevent access to the host layer by an unauthorized user using a selected security protocol during a performance mode of operation.

12. The apparatus of claim 11, in which the security component data is further adapted to facilitate access to the host layer by an authorized user during said performance mode of operation.

13. The apparatus of claim 11, in which the non-volatile memory is characterized as an array of spin torque random access memory (STRAM) memory cells.

14. The apparatus of claim 11, in which the service layer is adapted to be permanently placed into said performance mode of operation after execution of said testing mode of operation.

15. The apparatus of claim 11, in which the service layer further comprises a control circuit which respectively selects the testing and performance modes of operation.

16. The apparatus of claim 11, in which the security component data comprises a key, identification value, handler, or a configuration file.

* * * * *